United States Patent [19]

Hsia et al.

[11] Patent Number: 5,033,023

[45] Date of Patent: Jul. 16, 1991

[54] HIGH DENSITY EEPROM CELL AND PROCESS FOR MAKING THE CELL

[75] Inventors: Steve K. Hsia, Saratoga; Chan-Sui Pang, Sunnyvale; Christophe J. Chevallier, all of Calif.

[73] Assignee: Catalyst Semiconductor, Inc., Santa Clara, Calif.

[21] Appl. No.: 179,196

[22] Filed: Apr. 8, 1988

[51] Int. Cl.$^5$ .......................... G11C 7/00; G11C 16/02
[52] U.S. Cl. ................................. 365/185; 365/238.5; 365/104; 357/23.5
[58] Field of Search ............... 365/182, 185, 189, 230, 365/235, 103, 104, 189.01, 238.5, 189.09, 174, 189.04; 357/23.5

[56] References Cited

U.S. PATENT DOCUMENTS

| | | | |
|---|---|---|---|
| 4,432,075 | 2/1984 | Eitan | 357/23.5 X |
| 4,531,203 | 7/1985 | Masuoka et al. | 357/23.5 |
| 4,554,643 | 11/1985 | Kuo | 357/23.5 X |
| 4,590,503 | 5/1986 | Harari et al. | 365/185 X |
| 4,663,740 | 5/1987 | Ebel | 365/185 |
| 4,698,787 | 10/1987 | Mukherjee et al. | 365/185 |
| 4,803,529 | 2/1989 | Masuoka | 365/185 X |

OTHER PUBLICATIONS

Article entitled "A 128K Flash EEPROM Using Double-Polysilicon Technology", by George Samachisa, et al., IEEE Journal of Solid State Circuits, vol. SC-22, No. 5, Oct. 1987.

Article entitled "A Single Transistor EEPROM Cell and Its Implementation in A 512K CMOS EEPROM", by Satyen Mukherjee et al., from IEEE Technical Digest of IEDM 1985, pp. 616-619.

Primary Examiner—Stuart N. Hecker
Assistant Examiner—Alyssa H. Bowler
Attorney, Agent, or Firm—Skjerven, Morrill, MacPherson, Franklin & Friel

[57] ABSTRACT

Disclosed is a stacked gate electrically erasable programmable read only memory EEPROM cell which utilizes a floating region and a common pass transistor to provide a cell which is programmable at a relatively low drain voltage and which, in addition, by utilizing a pass transistor, overcomes the programming disturbance and false read problems associated with typical stacked gate memory cells. The cell is constructed such that programming and erasing functions take place at separate locations in the gate oxide. An EEPROM memory cell array, utilizing the above memory cell, is disclosed which provides the ability to achieve both byte erase and block erase as well as byte write capability. Also disclosed is a process for producing such a memory cell and memory array.

15 Claims, 7 Drawing Sheets

HIGH DENSITY EEPROM CELL AND PROCESS FOR MAKING THE CELL

BACKGROUND OF THE INVENTION

1. Field of the Invention

This invention relates to a high density electrically erasable and programmable nonvolatile memory cells and more particularly to a high density nonvolatile memory cell utilizing a stacked gate floating gate transistor, a pass transistor and a floating diffusion region, and a process for making such a cell.

2. Description of the Prior Art

In semiconductor memory devices which are nonvolatile, information that is stored is not lost when the power supply is removed. Memory devices of this type include the EPROM (Erasable Programmable Read-Only Memory) and the EEPROM (Electrically Erasable and Programmable Read-Only Memory). A typical EPROM uses single transistor cell which has two stacking polysilicon gates. The upper gate is a control gate and the bottom gate is a floating gate disposed between the control gate and the substrate. Programming or writing is accomplished by injection of hot electrons from the channel region through an oxide layer in response to high applied drain voltage and control gate voltage. The injected electrons are stored in the floating gate until an erasing action is taken. Erasure is accomplished by photoemission of the stored electrons from the floating gate to the control gate and the substrate. Practical EPROM cell programming requires high channel current, high programming voltages at the drain as well as at the control gate, and therefore cannot be programmed using a single standard five-volt power supply. For standard EPROM products, an additional power supply of higher voltage is required for programming.

Most conventional EEPROM products are made using dual element cells, which consist of two individual transistors, namely, a select transistor and a floating gate transistor. Programming and erasure are accomplished by means of Fowler-Nordheim effect which allows electrons to tunnel through an insulating layer between two electrodes. Information is stored by putting either positive charges or negative charges on a floating gate. During a read operation, the charge status of the EEPROM cell is detected by sensing the current that passes a select transistor. Conventional EEPROM cells require a select transistor and an area to situate a tunnel window, thus requiring a larger cell size as compared to an EPROM cell. Although the Fowler-Nordheim tunneling also requires high voltages, since they need not consume high current, the required high voltages can be provided by use of an on-chip voltage pump, which elevates the standard five-volt supply voltage to a higher level. Generally, an EPROM cell requires less area to implement than does an EEPROM cell, but the EPROM cell requires an external power supply for the programming operation.

It is highly desirable to produce a nonvolatile memory cell which has a small cell size and which can be programmed with the standard five-volt power supply. A prior art has attempted to achieve this by utilizing a short channel EPROM cell. As described in the article entitled "A Single Transistor EEPROM Cell and Its Implementation in A 512K CMOS EEPROM" by Satyen Mukherjee et al., which appeared in the IEEE Technical Digest of IEDM 1985, pages 616-619, a stacked gate cell is described which is said to be programmable with less than five volts on the drain. Programming may be achieved with the five volts by utilizing a relatively short channel length, however uncontrolled drain-to-source breakdown due to process related gate length variations renders the cell to have the disadvantage that when programming other bits sitting on the same bit line, the unintended cells may be deprogrammed, such phenomenon being known as programming disturbance. Accordingly, the challenge is to provide a nonvolatile memory cell which can be programmed with five volts and which will not suffer from programming disturbance. It is additionally desirable to provide an EEPROM memory cell which can tolerate the undesired overerased condition, in which positive charges are stored in the floating gate due to excessive tunneling. Without a select transistor, under a normal read mode operation, such a condition can cause current to leak through unaddressed cells along a selected bit line and therefore can be confused with the real cell current of a selected bit.

To overcome the programming disturbance and false read problems noted above, an attempt has been made by using two-transistor EEPROM cells utilizing a split gate. A typical split-gate flash EEPROM cell has been described in an article entitled "A 128K Flash EEPROM Using Double-Polysilicon Technology" by Gheorghe Samachisa et al. which appeared in the IEEE Journal of Solid State Circuits Vol SC-22, No. 5, October 1987. This type of split-gate cell has a disadvantage of needing high drain voltage for programming and it does not have the capability for byte erase.

The need for programming an EEPROM memory cell using lower voltages has been addressed in U.S. Pat. No. 4,698,787 to Mukherjee et al., issued Oct. 6, 1987. The Mukherjee et al patent discloses a cell in which cell programming can be achieved by hot electron injection by raising the drain to about 5 volts, while the control gate is pulsed at an amplitude of approximately 10 to 12 volts. Although this represents an improvement in programming voltage required, because of the construction of the cell in Mukherjee et al., arrays produced with such cells can only have the capability of providing either byte erase or block erase, but not both utilizing a single array structure. From their circuit of FIG. 5d and the partial view of the array layout illustrated in FIG. 5c, as shown in the patent, it appears that the resistive loading in each cell is high and would limit the low drain programming voltage operations.

SUMMARY OF THE INVENTION

It is an object of the present invention to provide a EEPROM cell utilizing two transistors and achieving such cell with a reasonably small cell size.

Another object of the present invention is to provide a EEPROM cell utilizing two transistors which may be programmed with a lower voltage than heretofore possible.

Still another object of the invention is to provide a EEPROM memory cell array with both byte erase and block erase as well as providing byte write capability.

Another object of the present invention is to provide a nonvolatile memory cell utilizing a pass transistor in such a fashion that erase through the source region is allowed and thereby provide improved program/erase endurance.

Yet another object of the present invention is to provide a EEPROM cell utilizing a pass transistor to eliminate programming disturbance, to provide for reliable reading, and to obtain selectable byte erase functions.

A further object of the present invention is to provide a process for producing a nonvolatile memory cell and a memory array utilizing such cells which achieves the above objectives.

In accordance with the invention, a semiconductor memory cell is provided which comprises a body of semiconductor material of first conductivity type; a first region of second conductivity type extending into body from a surface; a second region of second conductivity type extending into said body from said surface; a third region of second conductivity type extending into said body from said surface between the first and second regions; a first channel region extending to said surface between the first region and the third region; a first layer of insulating material on said surface above the first channel and above at least a portion of the first and third regions; a first conductor on the first insulating layer above the first channel, the first conductor having one edge overlying a portion of the first region and another edge overlying a portion at said third region; a second channel region extending to said surface between the second region and the third region; a second layer of insulating material on the surface above the second channel region and above at least a portion of the second and third regions; a second conductor on the second insulating layer above the second channel, with the second conductor having one edge overlying a portion of the second region and another edge overlying a portion of the third region; a third layer of insulating material on at least a portion of the second conductor; and a third conductor on the third insulating layer above the second conductor.

In accordance with another feature of our invention, a cell as set forth above is provided in which the thickness of the first insulating layer is greater than the thickness of the second insulating layer.

In yet a further feature of our invention, we provide a semiconductor memory cell as set forth above in which the first, second and third conductors are comprised of polycrystalline silicon material.

With yet another feature of our invention, we provide a semiconductor memory cell in accordance with the above in which the first channel region is implanted with a dopant of the same conductivity type as the body.

As yet another feature of our invention, we provide a semiconductor memory cell in which a dopant of conductivity type opposite to that of the body is included below the first and third regions.

As an additional feature of our invention, we provide a method of producing a memory cell comprising the steps of providing a body of semiconductor material of first conductivity type; providing first and second regions of second conductivity type extending into said body from a surface; providing a third region of second conductivity type between said first and second regions and extending into the body from the surface thereby forming a first channel region extending to the surface between the first and third regions and forming a second channel region extending to the surface between the second and third regions; providing a first layer of insulating material on the surface above the first channel region and extending said first layer of insulating material over at least a portion of said first and third regions; providing a first conductor on the first layer of insulating material, and extending the first conductor across the first channel region with one edge of the first conductor overlying a portion of the first region and another edge of the first conductor overlying a portion of the third region; providing a second layer of insulating material on the surface above the second channel region and extending the second layer of insulating material over at least a portion of the second and third regions; providing a second conductor on the second insulating layer, and extending the second conductor across the second channel region with one edge of the second conductor overlying a portion of the second region and another edge of the second conductor overlying a portion of the third region; providing a third layer of insulating material on the second conductor; and providing a third conductor on the third insulating layer above the second conductor.

As a further feature of our invention, we provide a process for producing a memory cell as set forth above in which the thickness of the first insulating layer is greater than the thickness of the second insulating layer.

As another feature of our invention, we provide a process as set forth above in which the first, second and third conductors are comprised of polycrystalline silicon material.

As yet another feature of our invention, we provide a process for producing a memory cell which includes the step of implanting the first channel region with a dopant of the same conductivity type as the body.

In accordance with another feature of our invention, we provide a process for producing a semiconductor memory cell which includes the step of implanting the body in the areas where the first and third regions are to be provided with a dopant of conductivity type opposite to that of the body.

As an additional feature of the invention, a semiconductor memory device is provided which is formed in a body of semiconductor material of first conductivity type, said device including a plurality of storage bytes each of which includes a plurality of memory cells, wherein each cell comprises a floating gate transistor having a drain region of second conductivity type extending into the body from a surface, a floating region of second conductivity type extending into said body from said surface and spaced away from the drain region, a channel region extending to the surface between the drain region and the floating region, a layer of insulating material on the surface above the channel region, a floating gate on the insulating material, the floating gate having one edge overlying a portion of the drain region and another edge overlying a portion of the floating region, a layer of insulating material on the floating gate, and a control gate positioned on the insulating layer above the floating gate, and wherein each storage byte includes a common pass transistor (which in the alternative may be referred to as a select transistor) comprising a source region of second conductivity type extending into the body from the surface and spaced away from the floating region, a channel region extending to the surface between the source region and the floating region, a layer of insulating material on the surface above the channel between the source region and the floating region and a pass gate (which may alternatively be referred to as a select gate) on the insulating layer above the channel region between the source region and the floating region, the pass gate (select gate) having one edge overlying a portion of the floating region and another edge overlying a portion of the source region.

In accordance with another feature of the invention, a semiconductor memory device as set forth above is provided wherein one common floating region serves all memory cells in a storage byte.

In accordance with yet another feature of the invention, a semiconductor memory device as set forth above is provided in which the channel region between the source region and the floating region is implanted with a dopant of the same conductivity type as the body.

As a further feature of the invention, a semiconductor memory device of the type set forth above is provided in which a dopant of conductivity type opposite to that of the body is included below the source region and the floating region.

In accordance with a further feature of our invention, we provide an electrically erasable semiconductor memory device for storing data words in a word storage location, each said word storage location having a plurality of storage cells which are arranged in a row with each cell in said row addressable by a column address line and a row address line, each of said cells in said word storage location having a drain region coupled to a predetermined column address line, a floating gate, a control gate positioned above said floating gate, means connecting each of said control gates in common, and wherein one floating region serves each of said cells in said word storage location, one source region serves each of said cells in said word storage location and wherein each word storage location further includes a pass gate (select gate) positioned above at least a portion of said source region and a portion of said floating region, means coupling said pass gate (select gate) to a predetermined row address line, said memory device further including a source line coupled to said source region, a sense line, and gate means for connecting said sense line to the commonly connected control gates of the cells in said word storage location in response to a signal from said row address line for said word storage location.

BRIEF DESCRIPTION OF THE DRAWINGS

Other objects and advantages of the invention will become apparent from the study of the specification and drawings in which.

DETAILED DESCRIPTION OF THE INVENTION

Figure 1:
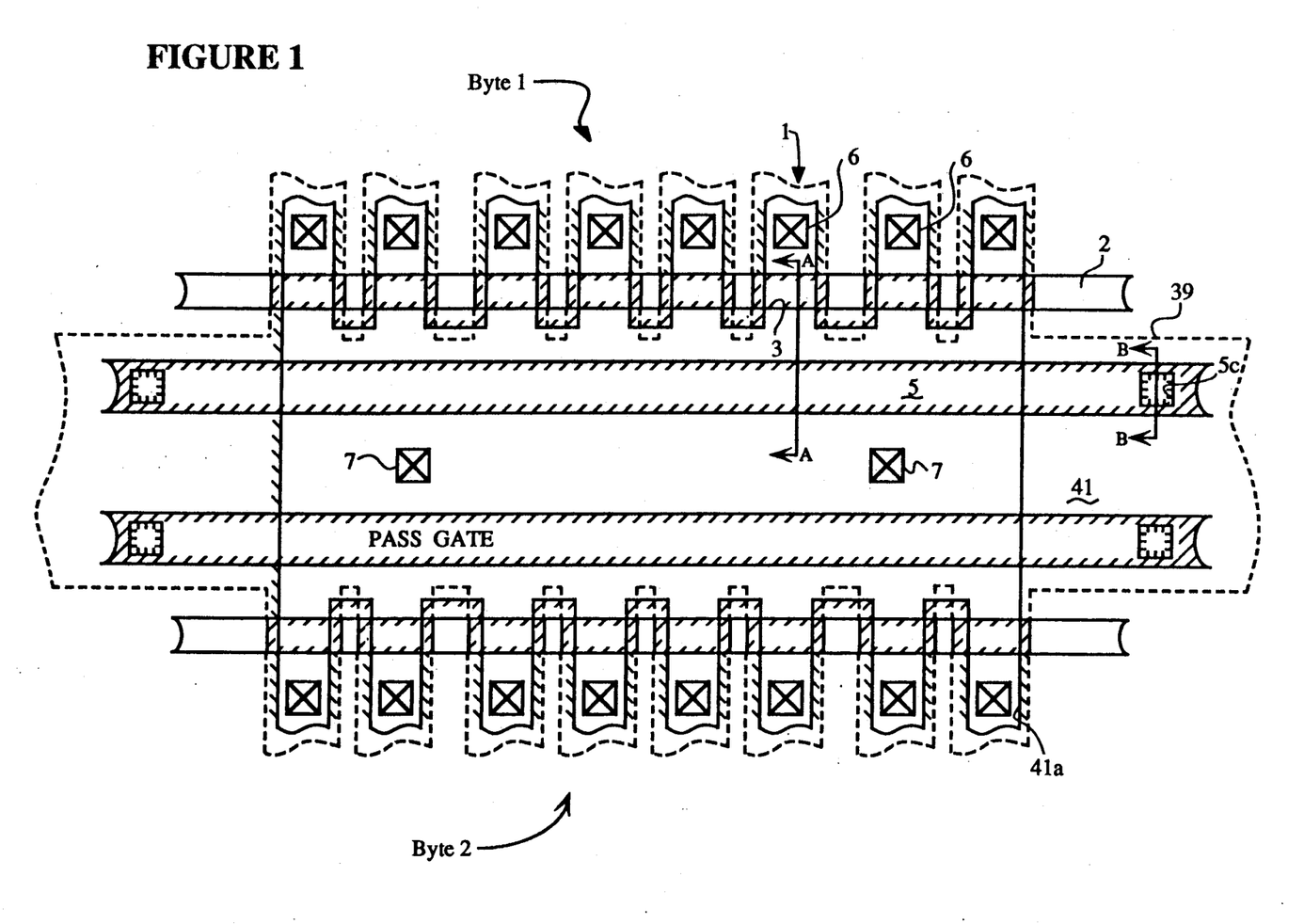
FIG. 1 is a plan view of two storage bytes each composed of eight memory cells made in accordance with our invention.
Figure 2:
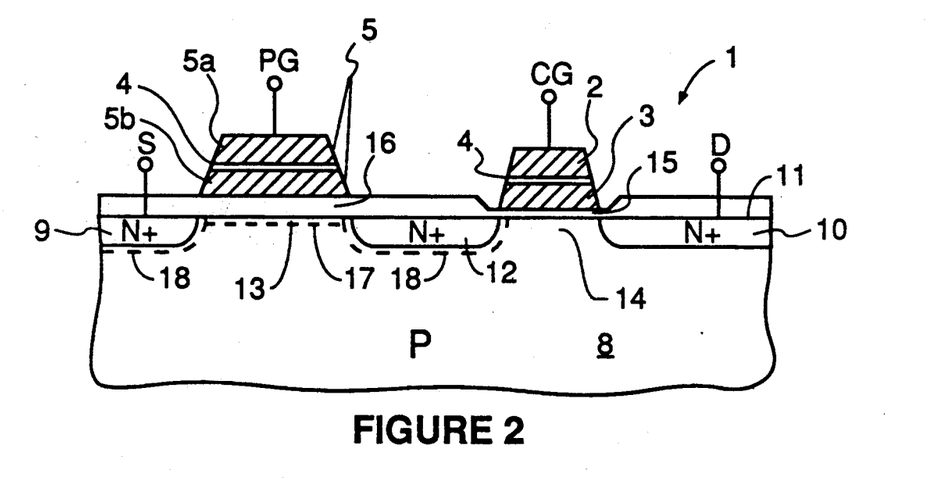
FIG. 2 is a highly enlarged cross-section taken along lines A—A of FIG. 1.
Figure 3:
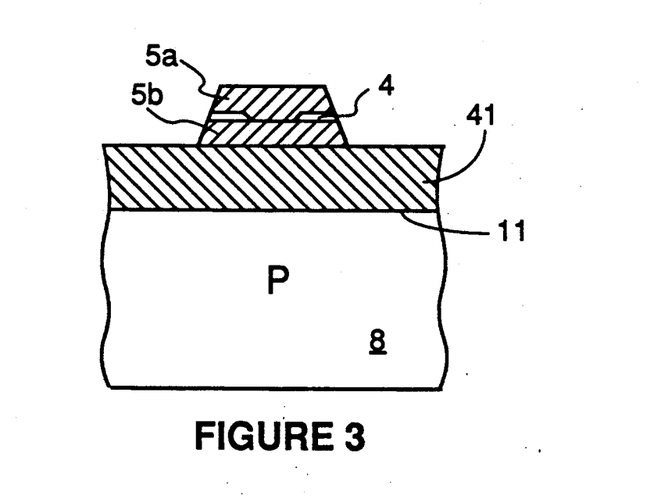
FIG. 3 is a highly enlarged cross-sectional view taken along lines B—B of FIG. 1.

Referring to FIG. 1, there disclosed is a plan view illustrating two bytes (Byte 1 and Byte 2) of memory array 45, which is illustrated schematically in FIG. 5, and which will be described fully hereinafter. Each byte includes eight memory cells 1 which are produced in a body of semiconductor material. Each memory cell 1 includes a floating gate transistor and a pass transistor, and one memory cell 1 is illustrated in cross section in FIG. 2. The pass transistor may also be referred to as a select transistor since it functions in the selection of cells in the write, read, and erase operations. Although memory array 45 illustrated herein includes storage blocks consisting of bytes of information having eight bits each, it will of course be appreciated that the invention is not limited to storage blocks having any particular number of bytes, or any particular number of cells in each byte. Reference to FIGS. 1, 2 and 3 will help the reader understand the structure of the present invention with FIGS. 2 and 3 illustrating portions of memory cell 1 taken along lines A—A and B—B respectively in FIG. 1. Memory cell 1 includes control gate 2 which, as can be observed in FIG. 1, is common to each of the memory cells on a byte line. Beneath control gate 2 is floating gate 3, which in FIG. 1 is indicated by the rectangular area partially crosshatched which is located directly below control gate 2. Control gate 2 and floating gate 3 are separated by interpoly-dielectric 4 (best illustrated in FIG. 2). As will be appreciated by reference to FIG. 1, Byte 1, which in this embodiment includes eight memory cells 1, has one common pass gate 5 (which may alternatively be referred to as a select gate), which is comprised of two layers of polycrystalline silicon material as can best be observed in FIG. 2, which serves each of the memory cells in Byte 1. The upper and lower portions of pass gate 5, 5a and 5b respectively, are interconnected through a via 5c, a cross-section of which is illustrated in FIG. 3 which is taken along lines B—B of FIG. 1. It is preferred that, though not necessary, the connections between portion 5a and 5b are established in the field oxide 41 area outside of the active memory cell areas to preserve the gate oxide integrity of the pass transistor. The perimeter of field oxide 41 is indicated in FIG. 1 by the line which is partially crosshatched and indicated by reference character 41a. It should be understood that the pass gate via 5c may be made over gate oxide area in order to achieve a more compact cell size if a tighter process control is exercised.

Also illustrated in FIG. 1 are drain contacts 6, which provide electrical connection to external circuitry. In addition, source contacts 7 are also illustrated in FIG. 1. We have contemplated that in practicing our invention, pass gate 5 may be a single conductor rather than utilizing upper and lower layers 5a and 5b. It will also be observed with reference to FIG. 2 that upper portion 5a and lower portion 5b of pass gate 5 are separated by interpoly dielectric 4. It will also be appreciated by those skilled in the art that production of memory cell 1 involves utilizing two layers of polycrystalline silicon material which are patterned and etched to produce the structure illustrated in FIGS. 1, 2 and 3. As the upper and lower pass gates, 5a and 5b, are shunted through vias 5c, they are always treated as a single pass gate 5 in device operations. An advantage of the shunted pass gate is that the circuit speed would increase due to reduction in gate line resistance.

It should be noted that for all the figures included in this application, the dimensions in each figure are not necessary proportional to scale.

Referring to FIG. 2, memory cell 1 is comprised of body 8 of P-type semiconductor material having a resistivity in the range of 20-30 ohm-centimeter which body has been cut for the <100> crystalline structure orientation. Source region 9, drain region 10 and floating region 12 are formed in body 8 by ion implantation and diffusion processes on surface 11, the details of which will be hereinafter described fully with regard to FIGS. 4a through 4j. It will of course be understood that these regions may be formed by other means and our invention is not limited to forming these regions by a diffusion process. Source region 9, drain region 10 and floating region 12 are highly N-doped regions, which are indicated in FIG. 2 by the N+ included within those regions. Extending to surface 11 between source region 9 and floating region 12 is first channel region 13. Second channel region 14 extends to surface 11 between floating region 12 and drain region 10. For reasons that will be explained more fully hereinafter, we have found that in practicing our invention the effective length of second channel region 14 (as measured from the right-hand edge of floating region 12 to the left-hand edge of drain region 10) is preferred to be smaller than 0.7 microns so that low voltage programming at four to five volts (drain voltage) can be realized. The preferred length of first channel region 13 (as measured from the right-hand edge of source region 9 to the left-hand edge of floating region 12) is a minimum of 1.2 microns to suppress hot electron damage in the pass transistor and eliminate bit line disturb during programming. Floating gate 3 is positioned above second channel region 14 and rests on floating gate oxide 15 which rests on surface 11, floating gate oxide 15, which may be comprised of silicon dioxide or other suitable insulator, having a thickness of approximately 100–200 Å. Lower portion 5b of pass gate 5 is positioned above first channel region 13 and separated from surface 11 by pass gate oxide 16, which may be of a material as silicon dioxide or other suitable insulating material. When silicon dioxide is used for pass gate oxide 16, the preferred thickness is approximately 400–500 Å.

Referring again to FIG. 1, in the preferred embodiment each storage byte is formed by parallely joining a number of memory cells together, and while each memory cell has its individual drain region 10 (below its respective drain contact 6) and its individual floating gate 3, the joined cells within a byte share a common floating region 12 (which as can be seen in FIG. 2 extends from the edge of floating gate 3 to the edge of pass gate 5), a common pass gate 5, a common control gate 2, and a common source region 9. Each cell could, however, have its own floating diffusion and pass gate. However, by using one common floating diffusion resistance loading is reduced during programming and read operations.

Turning to FIG. 3, which is a cross-sectional view taken along lines B—B of FIG. 1, illustrating the connection between upper portion 5a and lower portion 5b of pass gate 5. The creation of this connection will be described hereinafter when a complete description of the process for producing memory cell 1 is set forth. As can be seen in FIG. 2, first channel region 13 includes an implant, indicated by dashed line 17, to adjust the threshold voltage. Typically, boron is added to channel 13 by ion implantation. It has also been found advantageous to introduce an additional dopant of conductivity type opposite to that of body 8 in the regions where source region 9 and floating region 12 will be formed. The function of this additional doping is to increase the junction breakdown voltage. Phosphorus is a preferred dopant for this purpose and such diffusion is indicated by the dashed lines 18 below source region 9 and floating region 12.

It is highly desirable to provide a nonvolatile memory cell having the ability to be programmed with a relatively low drain voltage, on the order of four to five volts. Our memory cell 1 is advantageously constructed such that a low voltage programming is achievable by reducing the channel length of the floating gate transistor and in addition we provide a pass transistor which gives us the ability to avoid a false reading should the floating gate transistor be overerased. For example, if the floating gate of a nonvolatile memory cell should be charged positively by overerasure, a negative threshold voltage results and when a read is performed an incorrect current sensing can exist. In operation, cell 1 is programmed by raising drain region 10 to +4 to +5 volts, placing +12 to +14 volts on control gate 2, placing +14V to +16V volts on pass gate 5 and grounding source region 9. Under these conditions, floating gate 3 is programmed by hot-electron injection in which electrons cross floating gate oxide 15 and are collected in floating gate 3. With the construction of our cell 1, the programming efficiency is enhanced by a large floating gate channel breakdown current in which more electrons travel from floating region 12 into channel 14 and thus results in stronger electron injection to floating gate 3. This is due to a low breakdown voltage of the floating gate transistor, of approximately less than two volts, as the result of the short length of channel 14. Thus it can be appreciated with this structure a low voltage program is achievable. To erase cell 1, source region 9 is placed at +16 to +17 volts, pass gate 5 is placed at +17 to +19 volts, control gate 2 at ground and drain region 10 is set to float. The electrons stored in floating gate 3 are attracted to floating region 12 and cross floating gate oxide 15 by Fowler-Nordheim tunneling mechanism.

The typical conditions for reading the programmed/erased status of cell 1 is to ground source region 9, apply 5 volts to pass gate 5, apply +3 volts to control gate 3 and place the drain at +1.5 volts. By applying the +3 volts to control gate 2 we ensure that soft-programming of cell 1 does not occur.

The importance of the pass gate 5 can be characterized as follows: (A) In program mode, pass gate 5 can prevent unselected cells from punching through, and eliminates the associated bitline programming disturbance; (B) In erase mode, the pass gate controls the high voltage signal at the source region 9 to arrive at the floating region 12, so that selective byte erase can be achieved; and (C) In read mode, the pass gate can block off any leakage current coming from unselected and overerased memory cells sharing the same bitline, so that the bitline current consists of only that of a selected cell, and thus prevents any false reading.

As can be appreciated in FIG. 1, common pass gate 5 arrangement in our invention is most significant particularly in the program mode for low voltage applications. Because of the large available gate width in common pass gate 5 and the very short floating region 12, which connects the first channel 13 to the second channel 14, only very low resistive loading exists in each cell, so that most of the bitline programming voltage is dropped across the second channel region 14, and effective programming can be realized even at low drain voltage.

Figure 4A:
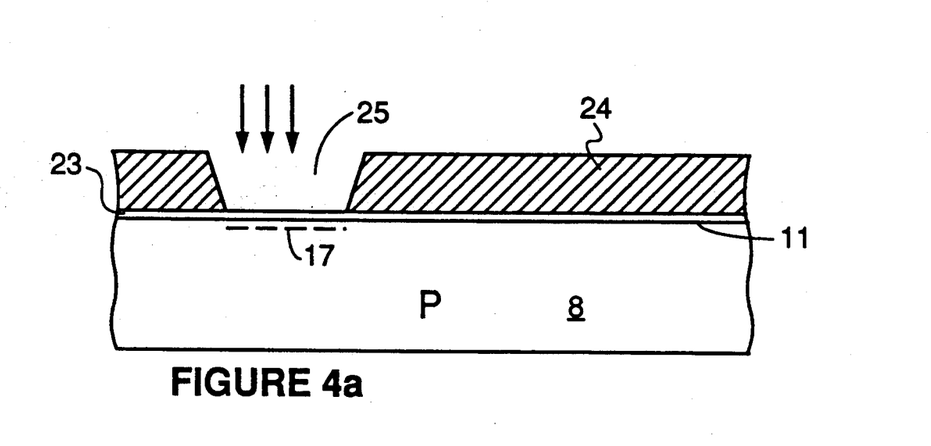
FIGS. 4a-4j are greatly enlarged cross-sectional views illustrating the process for practicing our invention.
Figure 4B:
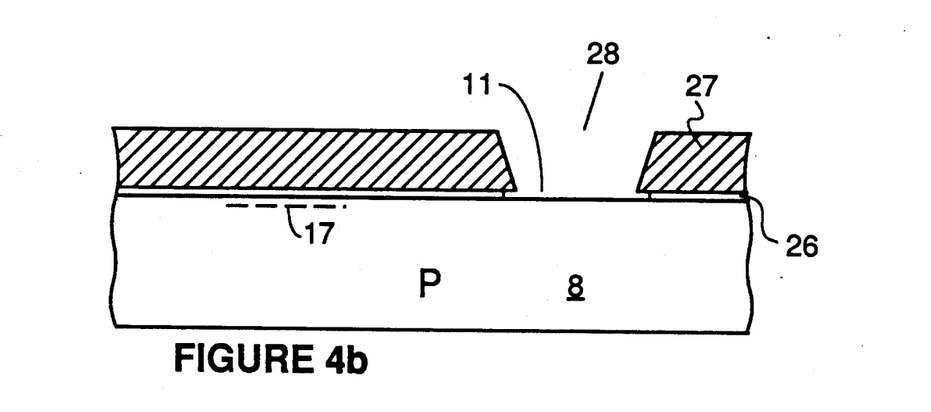
Figure 4C:
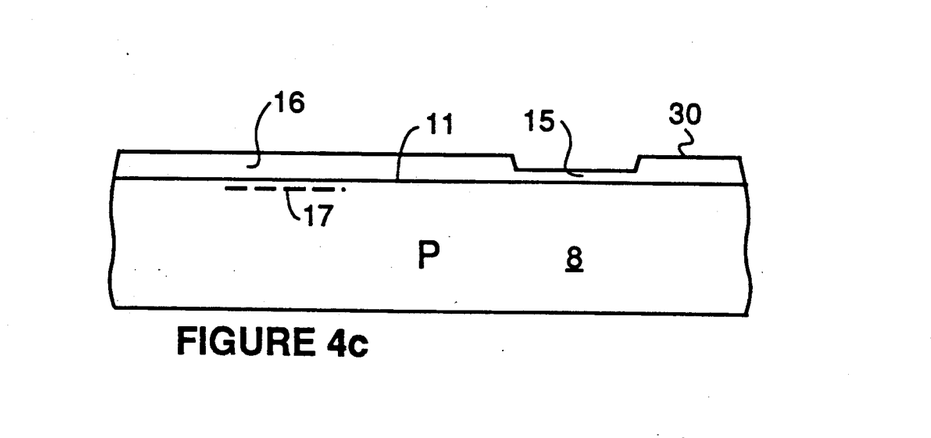
Figure 4D:
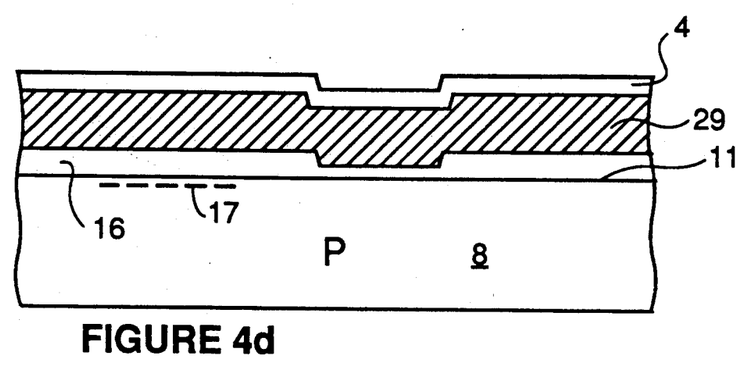

The process for producing memory cell 1 will be described with the aid of FIGS. 4a through 4j. The process begins, as illustrated in FIG. 4a, by providing a semiconductor body 8 of P-type material which is cut on the <100> crystal orientation. It is preferable that the resistivity of body 8 be in the range of 20–30 ohm-centimeter. An implant oxide 23, such as silicon dioxide, is grown to a thickness of approximately 200 Å on surface 11 by subjecting body 8 to an oxygen atmosphere at approximately 1000° C. Next, a first photoresist 24 is applied to the surface of implant oxide 23 and patterned to provide opening 25 through which boron is implanted at 60KeV at a dosage of about $8 \times 10^{11}$ atoms/cm$^2$. This of course provides the cell implant indicated at 17 for the to-be-provided first channel region 13. Following the boron implant, first photoresist 24 and implant oxide 23 are removed, and insulating layer 26, preferably of silicon dioxide, is grown to a thickness of approximately 300–400 Å in an oxygen atmosphere at approximately 1000° C, then second photoresist 27 is applied and patterned to produce opening 28 in the location where it is desirable to later provide floating gate oxide 15. It should be noted that an optional implant similar to that of making cell implant 17 may be applied at this point to modify the near surface material condition at the second channel region 14. It should further be made clear that, if desired, such surface material modification may also be made at the same time when cell implant 17 is created. Insulating layer 26 is then removed, preferably by a buffered oxide etch solution, down to surface 11 of body 8. Following the etch of insulating layer 26 down to surface 11, second photoresist 27 is removed, body 8 is then placed in an oxygen atmosphere and heated to a temperature of approximately 1000° C. Body 8 is maintained in the above-noted condition until floating gate oxide 15 is grown to a thickness of approximately 100–200 Å and with this additional growth the thickness of oxide layer 26 is increased above boron implant 17, as well as the other non-etched areas of layer 26, to a thickness of approximately 400–500 Å. It will be recalled that for device 1 pass gate oxide 16 is 400–500 Å and accordingly this growth produces pass gate oxide 16 in the location indicated above surface 11 is illustrated in FIG. 4c.

Figure 4E:
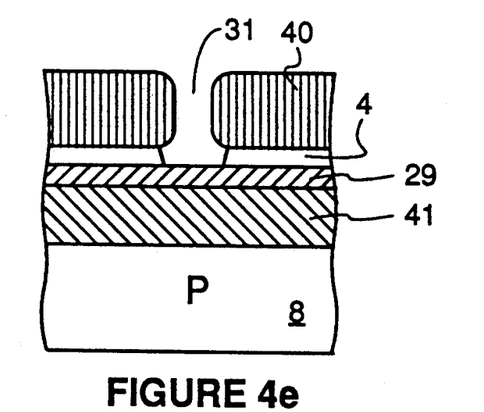
Figure 4F:
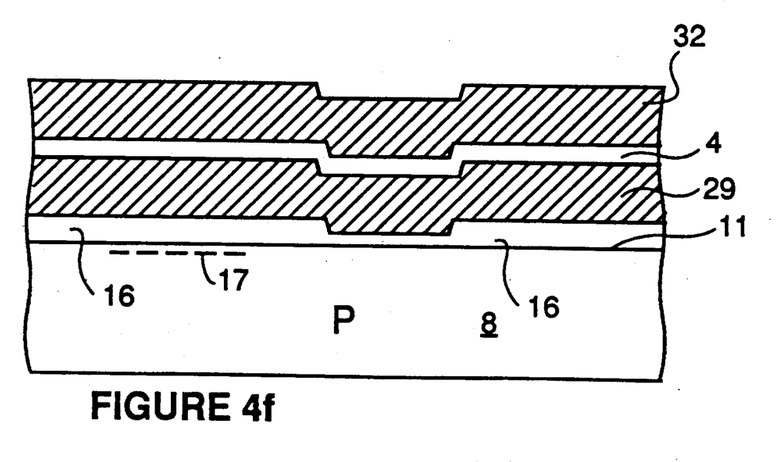

After the growth of silicon dioxide in the preceding step, first polycrystalline silicon layer 29 is deposited over surface 30 to a thickness of approximately 3000 Å and thereafter doped with phosphorus oxychloride (POCl$_3$)( to a doping concentration of from $4-5 \times 10^{20}$ atoms/cm$^3$. A third layer of photoresist (not shown) is applied, patterned and polycrystalline silicon layer 29 is etched to establish the pattern illustrated in FIG. 1 by dashed line 39 to prepare for the self-aligned etch to be performed in later steps (illustrated in FIGS. 4g and 4h). Following the etch of first polycrystalline silicon layer 29, the structure is placed in an oxygen atmosphere at approximately 1000° C. and interpoly oxide 4 is grown to a thickness of approximately 350–400 Å. Other well known insulators may be utilized instead of SiO$_2$ to provide insulation between first polycrystalline silicon layer 29 and second polycrystalline layer 32 (to be performed in a subsequent step). As will be recalled from the earlier discussion, pass gate 5 consists of both a first and a second poly layer which are connected through a via hole and it is at this point necessary to establish the beginnings of this connection. To do so, a fourth photoresist 40 is applied to the surface of interpoly oxide 4, an opening 31 established in fourth photoresist 40 over field oxide region 41, and interpolyoxide 4 is etched down to the upper surface of first polycrystalline silicon layer 29 at the location where a connection is desired between upper portion 5a and lower portion 5b of pass gate 5. This step is illustrated in FIG. 4e (along lines B—B of FIG. 1) where opening 31, established by the foregoing photoresist patterning and etching is illustrated. Next, the second polycrystalline silicon layer 32 is applied to the surface of interpoly oxide 4. Second polycrystalline silicon layer 32 is deposited to a thickness of approximately 4000–4500 Å and doped with phosphorus oxychloride to a concentration of from $7-8 \times 10^{20}$ atoms/cm$^3$. The resulting structure is illustrated in FIG. 4f.

Figure 4G:
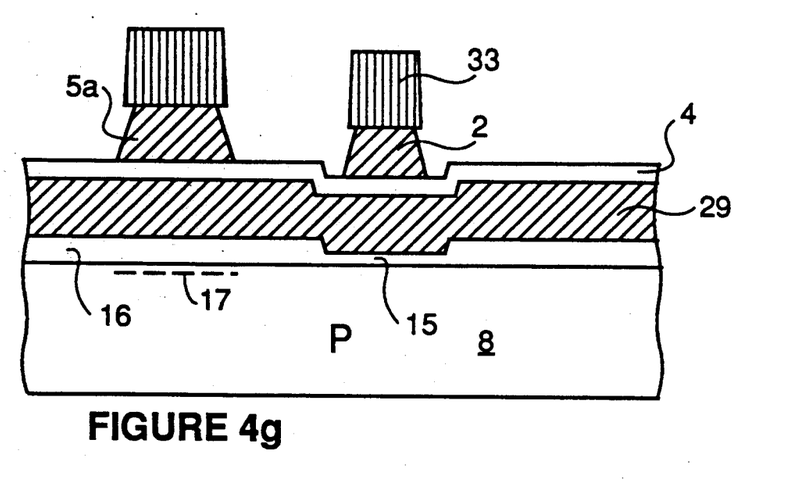
Figure 4H:
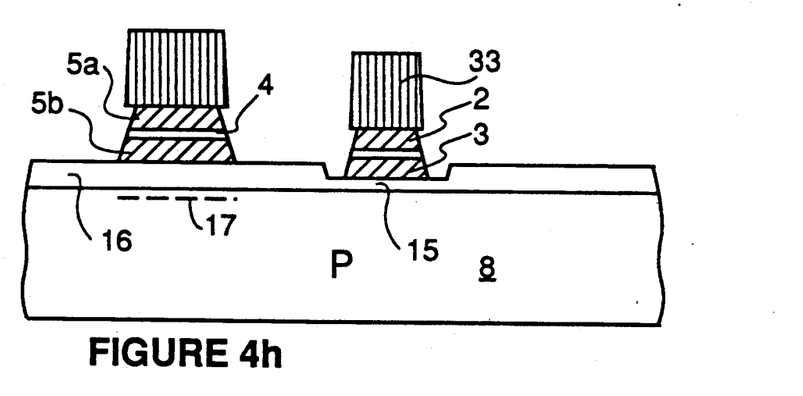
Figure 4I:
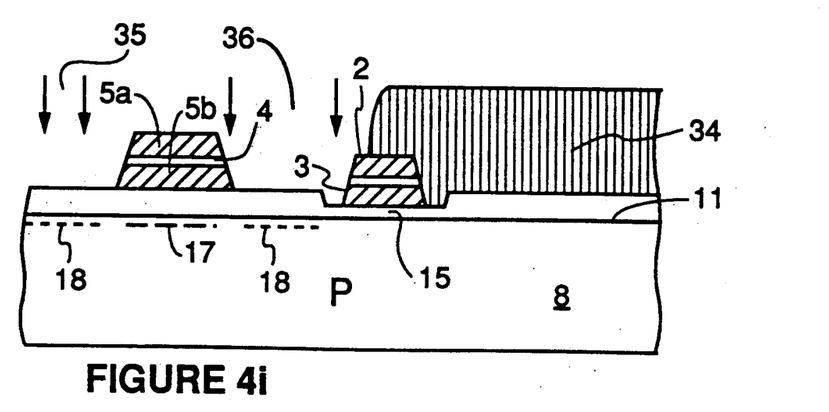
Figure 4J:
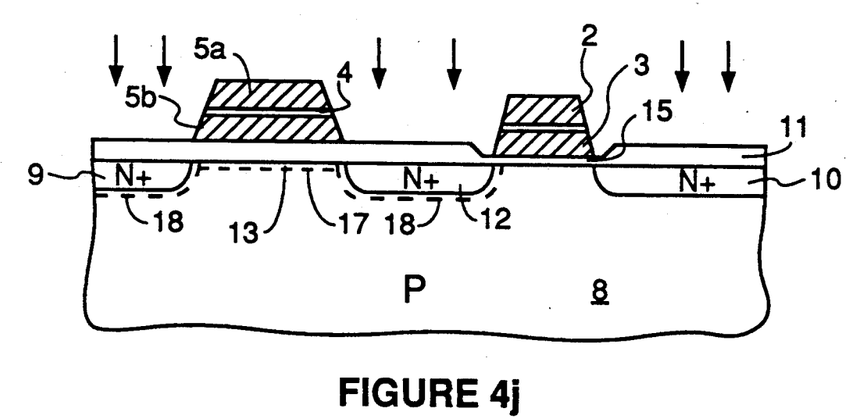

The stacked pass gate 5 and control gate 2 structures are formed by well known self-aligned etch techniques used in making UV EPROMs. At this step in the process, fifth photoresist 33 is applied to second polycrystalline silicon layer 32, patterned to provide the desired control gate and pass gate dimensions and second polycrystalline silicon layer 32 is etched by a plasma etch process. The etching is continued until second polycrystalline silicon layer 32 is etched down to the upper surface of interpolyoxide 4 as illustrated in FIG. 4g. Following the etch down to the upper surface of interpolyoxide 4, a sixth photoresist (not shown) is applied to protect the peripheral circuitry from being further etched during the following etch steps and then etching is resumed to remove undesired portions of interpoly oxide 4 and first polycrystalline silicon layer 29 to produce the structure illustrated in FIG. 4h. It is now desired to provide the phosphorus doping to the areas where source region 9 and floating region 12 will be established. To accomplish this, a seventh photoresist 34 is applied and patterned to leave openings 35 and 36 through which phosphorus is implanted at 60 KeV at a dosage of about $5 \times 10^{14}$ atoms per square centimeter. This provides phosphorus diffusions 18 as illustrated in FIG. 4i. Seventh photoresist 34 is then removed and drain region 10, floating region 12 and source region 9 are established by the implant of arsenic at 90 KeV in a concentration of $5 \times 10^{15}$ atoms per square centimeter to produce completed cell 1 illustrated in FIG. 4j. A high temperature implant activation process step is then followed. It will be appreciated that floating region 12 and source region 9 both have received two separate junction implants, and thus form doubly diffused junctions. It will also be appreciated at this point that the aforementioned "overlying" areas, for example, between floating gate 3 and floating region 12, are created as a result of lateral diffusions at the diode junctions. This completes the principal steps involved in producing the memory cell. However, it will be appreciated that additional processing will be necessary to, for example, provide a passivation layer to protect the memory cells.

Figure 5:
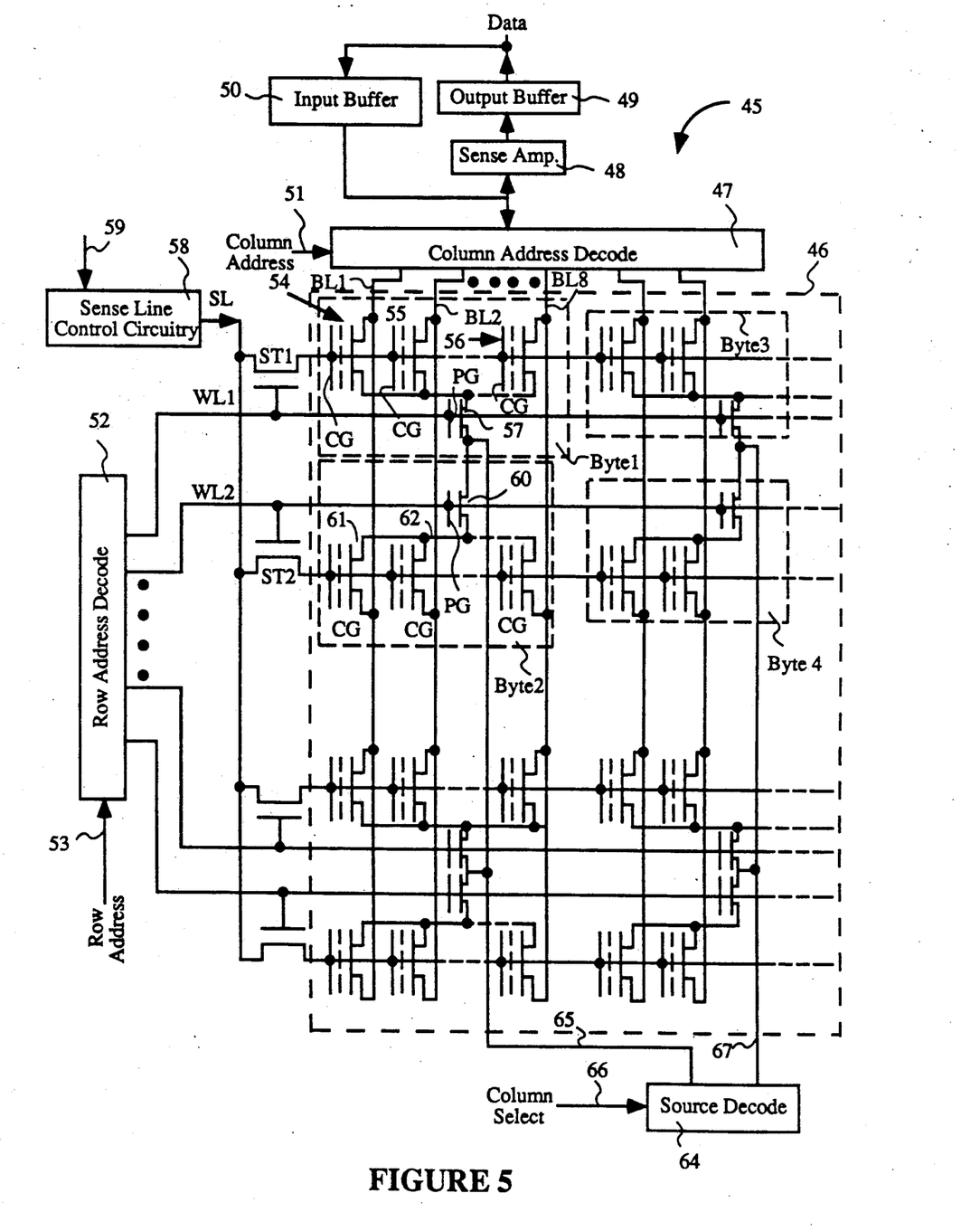
FIG. 5 is a simplified schematic of an array of memory cells in accordance with the present invention.

Referring to FIG. 5, memory array 45, included within dashed line 46 is an array block which is comprised of memory cells of the type set forth above, Bytes 1, 2, 3 and 4 indicated within dashed lines being shown in detail from a schematic standpoint. Conventional peripheral circuitry is utilized to program, erase, and sense the programmed or erased state of the memory cells. The peripheral circuitry includes column address decode circuitry 47, sense amplifier 48, output buffer 49 and input buffer 50. Column address information is provided to column address decode circuitry 47 over line 51 to provide the routing for information going to and coming from the bit lines (indicated for example BL 1, BL 2). In addition to the column address circuitry, row address circuitry is provided and includes row address decode circuitry 52 which receives row address information over line 53. Row address data provided to row address decode circuitry 52 over line 53 selects the appropriate word line, for example, word line 1 (WL 1), word line 2 (WL 2) shown in the upper left portion of FIG. 5, or other appropriate word line depending on the byte which is being addressed. Each word line connects to the pass gate (select gate) of the pass transistor select transistor for the byte, and more particularly in the case of word line 1, it is connected to the pass gate (select gate) of pass transistor (select transistor) 57 of byte 1. It will be recalled in particular with reference to FIGS. 1 and 2, each byte includes a common pass transistor (select transistor) which is utilized when the byte is to be read, programmed or erased. In FIG. 5, pass transistor 57 serves the memory cells of Byte 1. As will be more fully explained hereinafter, the pass transistors are activated by signals on word lines, indicated WL. For example, the pass gate of pass transistor 57 is controlled by the signal presented on word line 1 (WL1), which is activated when word line row address decode circuitry 52 receives commands over line 53. In similar fashion, word line WL2 is connected to the pass gate of pass transistor 60 which serves transistors 61, 62 and 63 in Byte 2. The word lines coming out of the row address decode circuitry 52 drive directly the byte pass gates, 57 and 60. Word lines are also effectively driving the control gates (CG) through sense transistors, ST1 and ST2, which are all connected to a vertical line, referred to as the sense line (SL). The sense transistors may be, for example, N-channel enhancement mode or native MOS transistors, or other suitable gate means, for connecting the control gates in the selected row to the sense line SL under the control of the word line for the selected row. Only one sense transistor, or other suitable gate means, is required per row and only one sense line is required per array. The output on line SL of sense line control circuit 59 will be zero volts for an erase operation, +14 V to +16 V for a write operation, and bias voltage of +5 volts for a read operation. The sense line signal can be passed onto the appropriate control gate by the output signal of the row address decoder, WL, which is connected to the gate of the sense transistor. Also included as part of the peripheral circuitry for memory array 45 is source decode circuitry 64 which is connected to the source of pass transistors in each byte column in the array, and includes line 65 which is connected to pass transistors 57 and 60 in the leftmost column of memory array 45. Column select information is provided to source decode circuitry 64 over line 66.

Turning to the operation of memory array 45, each byte in array 45 may be programmed, and to illustrate this programming, attention is directed to FIG. 5 where it will be described how Byte 1 is programmed. WL 1 and SL 1 are taken to a high potential of, for example, +14 to +16 volts and source line 65 is connected to ground. All of the other word lines are connected to ground. Byte 1 is now conditioned for programming. To program a bit in byte 1, the signal on the bit line (which is connected to a corresponding drain of one of the cells in Byte 1) is taken to a high voltage, say 4 to 5 volts, which results in hot electron injection to the floating gate of the corresponding cell. For bits in Byte 1 which not to be programmed, those bits lines should be set to float rather than to ground. It will be appreciated that although ground is also provided to the source of pass transistor 60 over line 65, Byte 2 will not be programmed since WL 2 is held at ground potential. As a precaution against programming undesired bytes, source line 67 will be set to float as will be all other unselected source lines in the array for those columns of bytes which do not include bytes that will be programmed. Furthermore, during a program mode, the bit lines in all the unselected columns are also set to float.

With memory array 45, it is possible to efficiently provide both byte erase and block erase. In the byte erase mode, the word line (WL) for the byte to be erased is brought to a high potential, such as +17 to +18 volts, the source line from source decode circuitry 64 for the column which selects the byte to be erased is brought high, the sense line is low and the bit lines are set to float. For example, in order to erase Byte 1, WL 1 is brought to +17 to 18 volts, source line 65 is brought to +16 to +17 volts, sense line is brought to zero as well as all other word lines are held low and bit lines BL 1 through BL 8 are kept floating Under these conditions, floating gate transistors 54, 55 and 56 see a high voltage in the floating diffusion region and a ground potential on the control gate. Byte 2 is not disturbed because word line WL2 is low. In order to ensure that the data in the unselected bytes on WL 1 remains undisturbed, the source lines of the unselected columns of bytes are held low, for example, as illustrated in FIG. 5, source line 67 would be held low.

With the present invention, as alluded to above, block erase is achievable, that is, all of the bytes in the same array block may be erased simultaneously, and with the present invention this may be achieved in less than ten milliseconds. To perform a block erase, the sense line would be set to provide ground to all control gates of the floating gate transistors in the array; all word lines WL1, WL2 and the remaining word lines are raised to a high potential, for example of +17 to +18 volts, thus providing high potential to the pass gate of pass transistors 57 and 60 as well as the other pass transistors in the array. Column address decode circuitry 47 would be set to provide for floating in all the bit lines on the block to be erased. Finally, all source lines (of which 65 and 67 are illustrated) would be raised to +16 to +17 volts at once. Under these conditions, all of the bytes in the array block would be erased simultaneously.

In another embodiment, we achieve block erase (but not byte erase) by eliminating source decode circuitry 64, connecting all of the source lines together and using one source control circuit to apply a positive potential of +16 volts to +17 volts to the commonly connected source lines.

Read mode operation of the array is straight forward: the source lines connected to source decode circuitry 64 are held low, a cell address is selected when its associated bitline, pass gate, and control gate receive read signals all at once. An example of the read signals is 2 volts for bitlines, and 3 to 4 volts for control gate, +5 volts for pass gate.

The foregoing is illustrative of one manner in which our invention may be practiced. It is of course understood that the scope of our invention is not limited to the above description, but only by the following claims.

We claim:
1. A semiconductor memory cell comprising:
    a body of semiconductor material of first conductivity type;
    a first region of second conductivity type extending into said body from a surface;
    a second region of second conductivity type extending into said body from said surface;

a third region of second conductivity type extending into said body from said surface between said first and second regions;

a first channel region extending to said surface between said first region and said third region;

a first layer of insulating material having a first thickness on said surface above said first channel and above at least a portion of said first and third regions;

a first conductor on said first insulating layer above said first channel, said first conductor having one edge overlying a portion of said first region and another edge overlying a portion of said third region;

a second channel region extending to said surface between said second region and said third region;

a second layer of insulating material having a thickness less than said first thickness on said surface above said second channel region and above at least a portion of said second and third regions;

a second conductor on said second insulating layer above said second channel, said second conductor having one edge overlying a portion of said second region and another edge overlying a portion of said third region;

a third layer of insulating material on at least a portion of said second conductor; and a third conductor on said third insulating layer above said second conductor.

2. A cell according to claim 1, wherein said first, second and third conductors are comprised of polycrystalline silicon material.

3. A cell according to claim 2, wherein said first channel region is implanted with a dopant of the same conductivity type as said body.

4. A cell according to claim 1, wherein said first channel region is implanted with a dopant of the same conductivity type as said body.

5. A cell according to any of claims 1, 2 or 3, wherein a dopant of conductivity type opposite to that of said body is included below said first and third regions.

6. A semiconductor memory device formed in a body of semiconductor material of first conductivity type, said device including a plurality of storage bytes each of which includes a plurality of memory cells, wherein each memory cell comprises a floating gate transistor having a drain region of second conductivity type extending into the body from a surface, a floating region of second conductivity type extending into said body from said surface and spaced away from said drain region, a channel region extending to said surface between said drain region and said floating region, a layer of insulating material on said surface above said channel region, a floating gate on said insulating material, said floating gate having one edge overlying a portion of said drain region and another edge overlying a portion of said floating region, a layer of insulating material on said floating gate, and a control gate positioned on said insulating layer above said floating gate, and wherein each memory cell includes a select transistor comprising a source region of second conductivity type extending into said body from said surface and spaced away from said floating region, a channel region extending to said surface between said source region and said floating region, a layer of insulating material on said surface above said channel between said source region and said floating region and a select gate on said insulating layer above said channel region between said source region and said floating region, said select gate having one edge overlying a portion of said floating region and another edge overlying a portion of said source region.

7. The device of claim 6, wherein one common floating region serves all memory cells in each storage byte, and wherein one common select transistor serves all memory cells in each storage byte, and wherein one common source region serves all memory cells in each byte.

8. The device of claim 7, wherein the channel region between said source region and said floating region is implanted with a dopant of the same conductivity type as said body.

9. The device of claim 7 or 8, wherein a dopant of conductivity type opposite to that of said body is included below said source region and said floating region.

10. The device of claim 6, wherein the channel region between said source region and said floating region is implanted with a dopant of the same conductivity type as said body.

11. The device of claim 6 or 10, wherein a dopant of conductivity type opposite to that of said body is included below said source region and said floating region.

12. An electrically erasable semiconductor memory device for storing data words in a word storage location, each said word storage location having a plurality of storage cells which are arranged in a row with each cell in said row addressable by a column address line and a row address line, each of said cells in said word storage location having a drain region coupled to a predetermined column address line, a floating gate, a control gate positioned above said floating gate, means connecting each of said control gates in common, and wherein one floating region serves each of said cells in said word storage location, one source region serves each of said cells in said word storage location and wherein each word storage location further includes a select gate positioned above at least a portion of said source region and a portion of said floating region, means coupling said select gate to a predetermined row address line, said memory device further including a source line coupled to said source region, a sense line, and gate means for connecting said sense line to the commonly connected control gates of the cells in said word storage location in response to a signal from said row address line for said word storage location.

13. A memory device according to claim 12, wherein said device further includes a plurality of said word storage locations arranged in rows and columns, and wherein within each column of word storage locations the drain regions of each cell in common columns are connected in common, the source regions of each word location in a column are connected in common;

a source line is provided for each column of word locations and said source line is connected to said commonly connected source regions of the column;

the control gates of the storage cells of the word storage locations in the same row are connected in common;

a sense line is provided for the plurality of word storage locations;

a gate means is provided for each row of word storage locations for selectively connecting said sense line to the commonly connected control gates in said row of word storage locations; and the select gates for each word storage location in the same row are connected in common and to said row address line for the row of word storage locations.

14. The memory device according to claim 13, wherein the source lines for each column of word locations are connected in common.

15. The semiconductor memory device according to any of claims 12, 13, or 14, wherein said gate means comprises a MOS device.

* * * * *